United States Patent
Yan et al.

(10) Patent No.: US 9,288,098 B2
(45) Date of Patent: Mar. 15, 2016

(54) METHODS AND APPARATUS FOR ENVELOPE TRACKING SYSTEM

(71) Applicant: MEDIATEK INC., Hsin-Chu (TW)

(72) Inventors: Sheng-Hong Yan, Tainan (TW); Hao-Ping Hong, Hsinchu County (TW)

(73) Assignee: MediaTek, Inc. (TW)

( * ) Notice: Subject to any disclaimer, the term of this patent is extended or adjusted under 35 U.S.C. 154(b) by 0 days.

(21) Appl. No.: 14/612,305

(22) Filed: Feb. 3, 2015

(65) Prior Publication Data

US 2015/0195118 A1    Jul. 9, 2015

Related U.S. Application Data

(63) Continuation of application No. 14/151,786, filed on Jan. 9, 2014, now Pat. No. 9,065,509.

(51) Int. Cl.
| | |
|---|---|
| *H03F 1/32* | (2006.01) |
| *H04B 1/04* | (2006.01) |
| *H04L 27/34* | (2006.01) |
| *H03F 3/24* | (2006.01) |

(52) U.S. Cl.
CPC ............. *H04L 27/3411* (2013.01); *H03F 3/24* (2013.01); *H04B 1/0475* (2013.01); *H03F 2200/105* (2013.01); *H03F 2200/465* (2013.01); *H03F 2200/504* (2013.01); *H04B 2001/0408* (2013.01)

(58) Field of Classification Search
CPC ... H03F 1/0211; H03F 1/0222; H04B 1/0475; H04B 2001/0408
USPC ................................. 375/297, 296; 330/297
See application file for complete search history.

(56) References Cited

U.S. PATENT DOCUMENTS

| | | | |
|---|---|---|---|
| 2005/0110562 A1 | 5/2005 | Robinson |
| 2013/0034250 A1 | 2/2013 | Ozaki |

OTHER PUBLICATIONS

Hassan, A Combined Series-Parallel Hybrid Envelope Amplifier for Envelope Tracking Mobile Terminal RF Power Amplifier Applications, IEEE Journal of Solid-State Circuits, vol. 47, No. 5, pp. 1185-1198, May 2012.
Jeong, Wideband Envelope Tracking Power Amplifiers With Reduced Bandwidth Power Supply Waveforms and Adaptive Digital Predistortion Techniques, IEEE Transactions on Microwave Theory and Techniques, vol. 57, No. 12, pp. 3307-3314, Dec. 2009.
Cesari, A DSP structure authorizing reduced-bandwidth DC/DC Converters for Dynamic Supply of RF Power Amplifiers in Wideband Applications, pp. 3361-3366, 2006 IEEE.
Modi, Reduced Bandwidth Class H Supply Modulation for Wideband RF Power Amplifiers, WAMICON, 2012 IEEE 13th Annual, Apr. 2012.
Montoro, Slew-Rate Limited Envelopes for Driving Envelope Tracking Amplifiers, 2011 IEEE Radio and Wireless Symposium, Jan. 2011.

*Primary Examiner* — Kevin Kim
(74) *Attorney, Agent, or Firm* — Optimus Patents US, LLC

(57) ABSTRACT

A communication unit has an envelope tracking system operably coupled to a power amplifier, PA, module. The envelope tracking system has at least one slew rate module arranged to re-distribute a slew rate across a number of input samples according to a maximum slew rate of the number of input samples; and a supply modulator arranged to variably control a supply voltage for the PA module in response to an output of the at least one slew rate module.

18 Claims, 7 Drawing Sheets

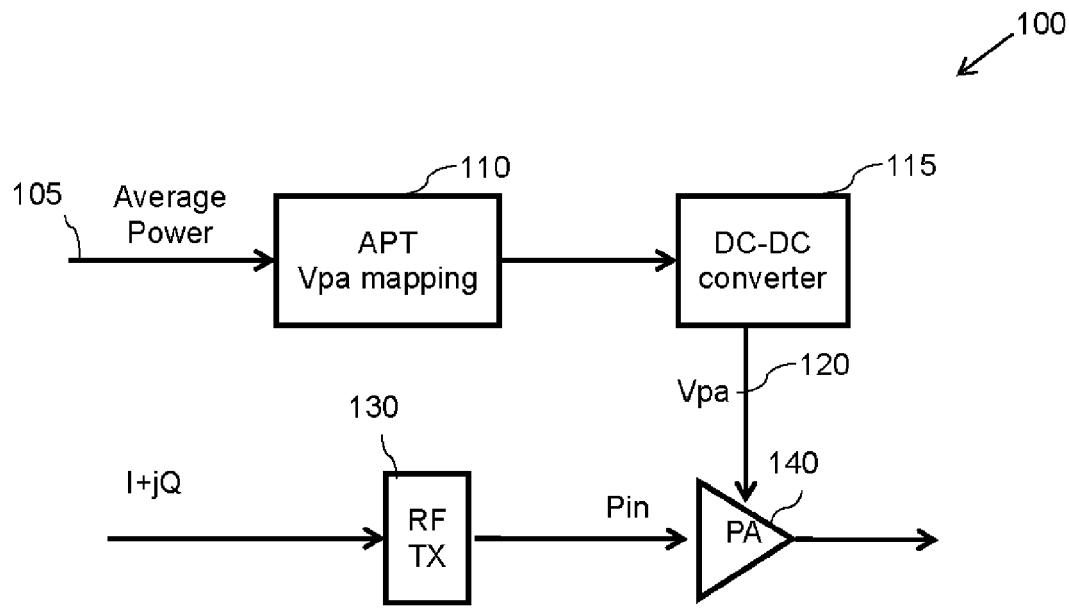
FIG. 1 – Prior Art
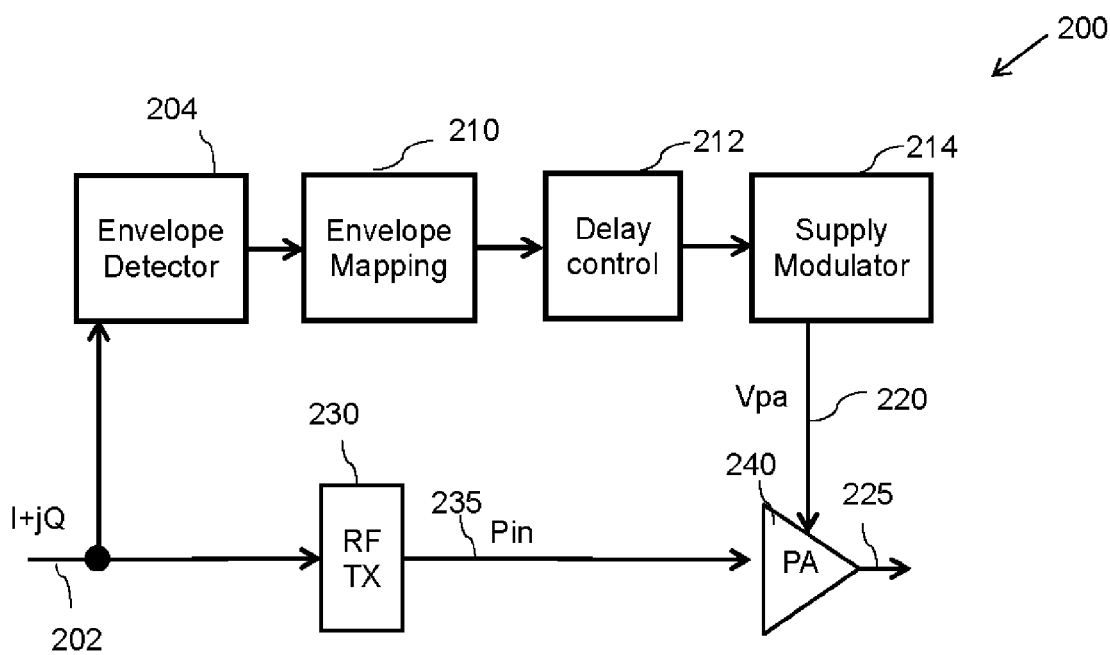
FIG. 2 – Prior Art

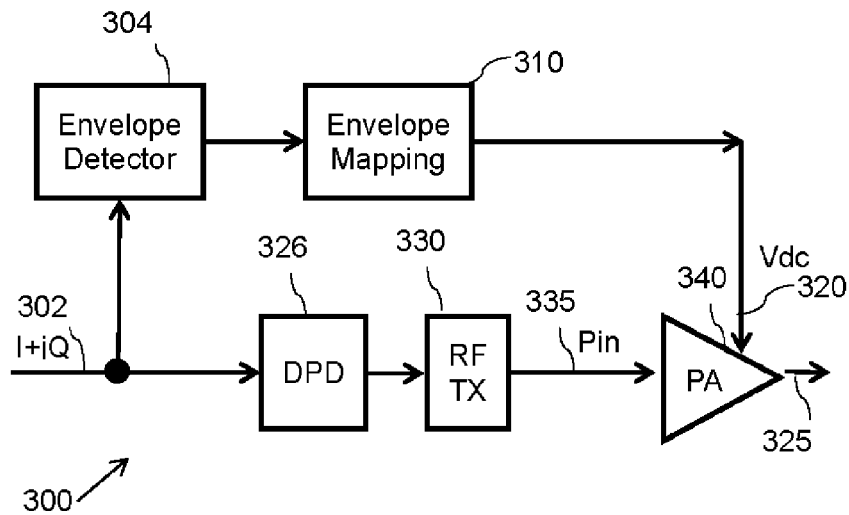
FIG. 3 – Prior Art
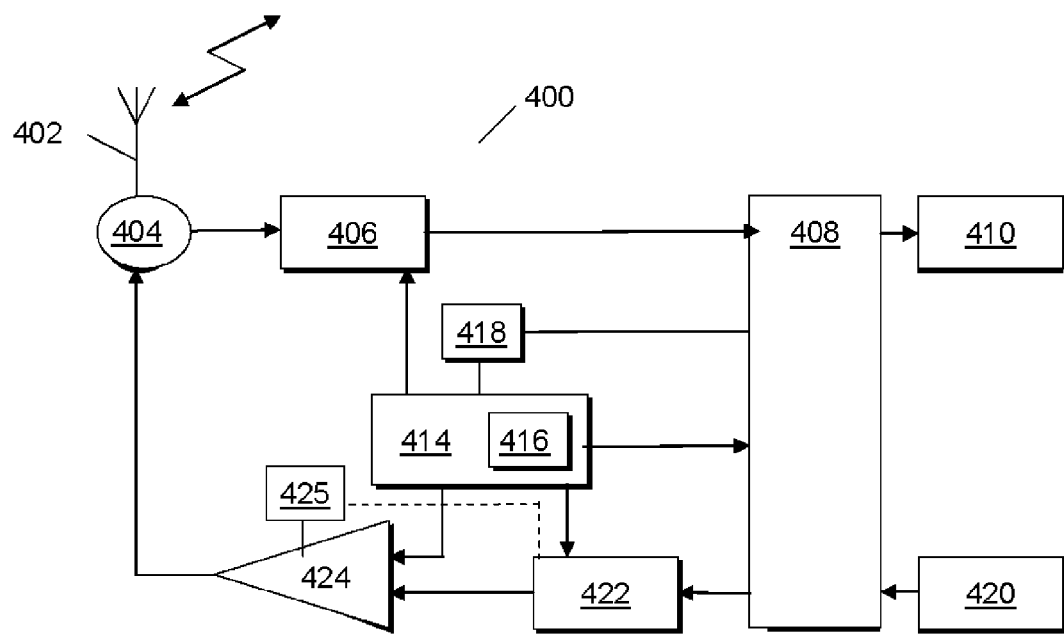
FIG. 4

METHODS AND APPARATUS FOR ENVELOPE TRACKING SYSTEM

CROSS REFERENCE TO RELATED APPLICATIONS

This continuation application claims the benefit of U.S. application Ser. No. 14/151,786, filed on Jan. 9, 2014 and incorporated herein by reference.

BACKGROUND

1. Field of the Invention

The field of this invention relates to methods and apparatus for an envelope tracking system, and in particular to methods and apparatus for improving an efficiency of an envelope tracking system for a power amplifier module, for example within a radio frequency (RF) transmitter module of a wireless communication unit.

2. Background of the Invention

A primary focus and application of the present invention is the field of radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Additionally, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, which are often used in designing linear transmitters, such as Cartesian Feedback, Feed-forward, and Adaptive Pre-distortion.

Voltages at the output of the linear, e.g. Class AB, amplifier are typically set by the requirements of the final RF power amplifier (PA) device. Generally, the minimum voltage of the PA is significantly larger than that required by the output devices of the Class AB amplifier. Hence, they are not the most efficient of amplification techniques. The efficiency of the transmitter (primarily the PA) is determined by the voltage across the output devices, as well as any excess voltage across any pull-down device components due to the minimum supply voltage (Vmin) requirement of the PA.

In order to increase the bit rate used in transmit uplink communication channels, larger constellation modulation schemes, with an amplitude modulation (AM) component are being investigated and, indeed, becoming required. These modulation schemes, such as sixteen-bit quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity. To help overcome such efficiency and linearity issues a number of solutions have been proposed.

One known technique, as illustrated in the block diagram 100 of FIG. 1, relates to controlling the supply voltage 120 provided to the power amplifier 140. The illustrated technique is known as average power tracking (APT). With APT, an average power level 105 of the transmitted signal is determined and applied to an APT-Vpa mapping module 110 that determines a supply voltage (Vpa) 120 to be applied to the PA 140 based on the determined average power level. This signal is then applied to a DC-DC converter 115 and the resultant (output) voltage is applied to the PA 140 as its supply voltage (Vpa) 120. This technique is known to provide high efficiency, but the speed of signal tracking is limited. Hence, DC-DC converters are typically used in average power tracking (APT) designs to accommodate signal tracking. One known problem with this technique is that APT operates with less efficiency at the higher output power levels when the peak to average power ratio (PAPR) back-off is large, which is predominantly the case for more complex modulation schemes.

Another known supply voltage technique 200 is envelope tracking (ET), illustrated in FIG. 2, which relates to modulating the radio frequency (RF) power amplifier (PA) supply voltage (Vpa) 220 to match (e.g. track) the envelope of the radio frequency waveform being transmitted by the RF PA 240. Typically, ET systems control the RF PA supply voltage 220 in order to improve PA efficiency through selecting a lower supply voltage dependent upon an instantaneous envelope of the input signal. ET systems are often also designed to improve linearity by selecting a RF PA supply voltage 220 dependent upon a constant PA amplification gain. A digital (quadrature) input signal 202 is input to an RF transmitter 230, whose output provides an input power level 235 to the RF PA 240. Concurrently, the digital (quadrature) input signal 202 is applied to an envelope detector 204 arranged to determine a real-time envelope of the signal to be transmitted (e.g. radiated). The determined real-time envelope signal output from the envelope detector 204 is input to an envelope mapping function 210, which is arranged to determine a suitable PA supply voltage (Vpa) 220 to be applied to the PA 240 in order to substantially match the instantaneous real-time envelope of the signal to be transmitted. The output from the envelope mapping function 210 is input to a delay control function 212 that aligns, in time, the PA supply voltage (Vpa) 220 to the signal being passed through RF transmitter 230. The output from the delay control function 212 is input to a supply modulator 214 that provides the PA supply voltage (Vpa) 220 to be applied to the PA 240.

With ET, the instantaneous PA supply voltage (Vpa) 220 of the wireless transmitter is caused to approximately track the instantaneous envelope (ENV) of the transmitted RF signal. Thus, since the power dissipation in the PA 240 is proportional to the difference between its supply voltage and output voltage, ET may provide an increase in PA efficiency, reduced heat dissipation, improved linearity and increased maximum output power 225, whilst allowing the PA to produce the intended RF output. However, the total system efficiency is affected by supply modulator efficiency that is related to the supply modulator design, supply voltage range, bandwidth and PA loading, which typically results in ET modulator efficiency not being high enough for most applications. The envelope mapping function 210 between ENV and Vpa is critical for optimum performance (efficiency, gain, and adjacent channel power (ACP)). Also critical to system performance is timing alignment between the RF signal and Vpa at the PA.

A yet further known technique 300 is to combine envelope tracking (ET) with digital pre-distortion (DPD), as illustrated in FIG. 3. Here, control/manipulation of the input waveform/signal in the digital domain is performed in order to compensate for PA nonlinearity (AM-to-AM and AM-to-PM) effects, thereby improving PA output linearity based on prior information or measured data of the PA system. Again, a digital (quadrature) input signal 302 is input to an RF transmitter 330 via a digital pre-distortion (DPD) function 326, whose output provides an input power level 335 to the RF PA 340. Concurrently, the digital (quadrature) input signal 302 is applied to an envelope detector 304 arranged to determine a real-time envelope of the signal to be transmitted (e.g. radiated). The determined real-time envelope signal output from the envelope detector 304 is input to an envelope mapping function 310, which is arranged to determine a suitable control voltage (Vdc) 320 to be applied to the PA 340

In this manner, envelope-tracking can be combined with digital pre-distortion (DPD) on the RF signal to improve adjacent channel protection (ACP) robustness. However, since the ET system is often a multichip implementation involving function blocks in digital baseband (BB), analogue BB, RF transceiver, power management and PA, consistent ET system performance cannot easily be guaranteed across all devices by hardware.

The overall transmitter efficiency is, in large part, dependent upon the efficiency of both the PA and the supply modulator path. In particular, the inventors have recognised that the efficiency usually decreases as the input signal bandwidth increases.

A number of other modulator designs are known. For example, a linear regulator/modulator design may be used, whereas although signal tracking is fast it is known to suffer from poor efficiency. As a result of the poor efficiency, it is rarely, if ever, used for ET applications. Another example is a hybrid modulator, which comprises a switching modulator and linear amplifier. In hybrid modulators, most of the envelope energy is delivered by the switching modulator, whilst the wide bandwidth of the envelope signal is supported by linear amplifier. However, the linear amplifier needs to accommodate large envelope bandwidths and also suppress switching noise. These requirements have an adverse impact on the hybrid modulator efficiency.

A paper titled 'Slew-rate limited envelopes for driving envelope tracking amplifiers' (by Gabriel Montoro, et al. and published by the Dept of Signal Theory and Communications by the Universitat Politecnica de Catalunya in Barcelona, Spain), describes a technique that sets a maximum value for a slew-rate limiter in an ET path, but has been identified as introducing some delays and out-of-band emissions of the supply modulator under varying load conditions.

A yet further paper titled 'A DSP structure authorizing reduced-bandwidth DC/DC Converters for Dynamic Supply of RF Power Amplifiers in Wideband Applications' (by Albert Cesari, et al. and published by the Groupe Integration de Systemes de Gestion de l'Energie in Toulouse, France), describes a technique that tracks a peak of an original envelope signal, but has been identified as also introducing some delays and creating poor out-of-band emissions of the supply modulator due to use of a DC/DC converter input step signal.

Thus, there is a need for a more efficient and cost effective solution to the problem of improving the overall transmitter efficiency, and in particular the supply modulation efficiency.

SUMMARY

Accordingly, the invention seeks to mitigate, alleviate or eliminate one or more of the above mentioned disadvantages singly or in any combination.

Aspects of the invention provide a communication unit, and a method of envelope tracking in a wireless communication unit.

According to a first aspect of the invention, there is provided a communication unit comprising an envelope tracking system operably coupled to a power amplifier, PA, module. The envelope tracking system comprises: at least one slew rate module arranged to re-distribute a slew rate across a number of input samples according to a maximum slew rate of the number of input samples; and a supply modulator arranged to variably control a supply voltage for the PA module in response to an output of the at least one slew rate module.

In this manner, the at least one slew rate module re-distributes a maximum slew rate across the number of input samples and consequently avoids a step input to the supply modulator that would cause out-of-band emissions, particularly under varying load conditions. Consequently, a more efficient and cost effective solution to the problem of improving the overall transmitter efficiency is improved, and in particular the supply modulation efficiency.

In an optional example embodiment, the at least one slew rate module limits a slew rate of an output sequence from the supply modulator to be applied to a supply of the PA module.

In an optional example embodiment, the at least one slew-rate module takes the number of input samples ($vpa_i(n-N+m)$, $m=0 \ldots N-1$) for each output sample provided by a envelope to reference voltage mapping module which is configured to map an envelope of an input signal of the communication unit to the supply voltage to be applied to the PA module.

In an optional example embodiment, the at least one slew-rate module calculates a current slew rate $S(m)$ corresponding to a current input sample $vpa_i(n-N+m)$ of the N input samples according to the current input sample and an output sample provided by the envelope to reference voltage mapping module.

In an optional example embodiment, the at least one slew-rate module influences a current output sample $vpa_o(n-N)$ of the envelope to reference voltage mapping module according to:

$$vpa_o(n-N)=vpa_o(n-N-1)+\max[S(1),S(2),S(3),\ldots S(N)].$$

In an optional example embodiment, a slew rate of envelope to reference voltage mapping values of the envelope tracking system is manageable, wherein the envelope to reference voltage mapping values are utilized to control the supply voltage to be applied to the PA module.

In an optional example embodiment, a slew rate of envelope to reference voltage mapping values of the envelope tracking system is evenly distributed, wherein the envelope to reference voltage mapping values are utilized to control the supply voltage to be applied to the PA module.

According to a second aspect of the present invention, there is provided a method of envelope tracking in a wireless communication unit. The method includes: receiving an input signal with an envelope that varies with time; mapping the envelope of the input signal to a power supply voltage to be applied to a power amplifier module to produce a voltage reference signal; sampling the voltage reference signal; and re-distributing a slew rate across a plurality of input samples of the voltage reference signal to provide an output sample variably control a supply voltage for the PA module.

In an optional example embodiment, a slew rate of an output sample sequence variably controlling the supply voltage for the PA module is limited.

In an optional example embodiment, the step of re-distributing the slew rate across the plurality of input samples of the voltage reference signal comprises calculating a current slew rate $S(m)$ corresponding to a current input sample $vpa_i(n-N+m)$ of the plurality of input samples.

In an optional example embodiment, the step of re-distributing the slew rate across the plurality of input samples of the voltage reference signal further comprises: influencing a current output sample $vpa_o(n-N)$ utilized to variably control the supply voltage for the PA module according to:

$$vpa_o(n-N)=vpa_o(n-N-1)+\max[S(1),S(2),S(3),\ldots S(N)].$$

In an optional example embodiment, a slew rate of the output sample variably controlling the supply voltage for the PA module is manageable.

In an optional example embodiment, a slew rate of the output sample variably controlling the supply voltage for the PA module is evenly distributed.

These and other aspects of the invention will be apparent from, and elucidated with reference to, the embodiments described hereinafter.

BRIEF DESCRIPTION OF THE DRAWINGS

Further details, aspects and embodiments of the invention will be described, byway of example only, with reference to the drawings. In the drawings, like reference numbers are used to identify like or functionally similar elements. Elements in the figures are illustrated for simplicity and clarity and have not necessarily been drawn to scale.

FIG. 1 illustrates a known block diagram architecture of an average power tracking (APT) technique.

FIG. 2 illustrates a known block diagram architecture of envelope tracking (ET) technique.

FIG. 3 illustrates a known block diagram architecture using a combination of envelope tracking (ET) with digital pre-distortion (DPD).

FIG. 4 illustrates a simplified generic block diagram of an example of a communication unit.

DETAILED DESCRIPTION

Figure 5:
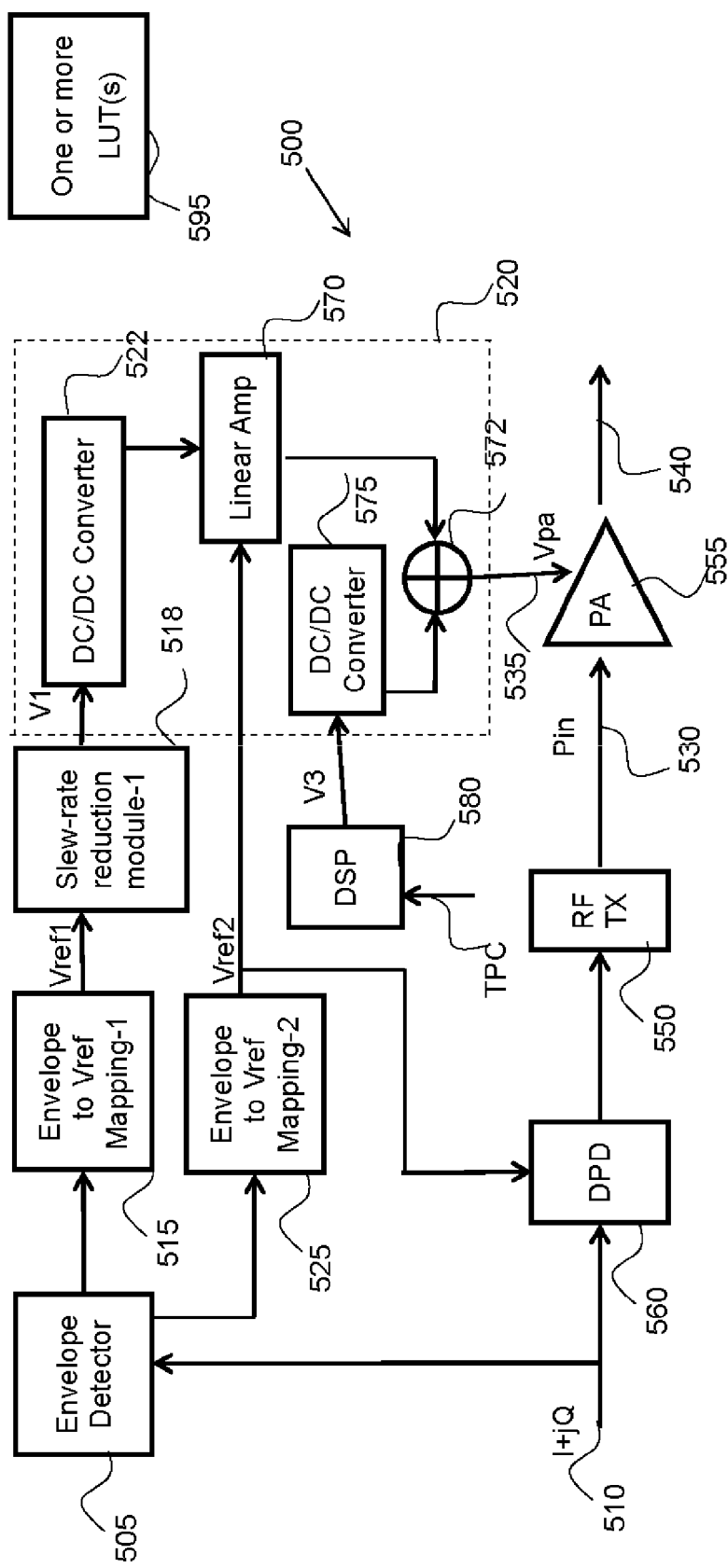
FIG. 5 illustrates a block diagram of a dynamic power amplifier supply modulation circuit employing envelope tracking and adapted in accordance with some examples of the invention.

Examples of the invention will be described in terms of one or more integrated circuits for use in a wireless communication unit, such as user equipment in third generation partnership project (3GPP™) parlance. However, it will be appreciated by a skilled artisan that the inventive concept herein described may be embodied in any type of integrated circuit, wireless communication unit or wireless transmitter that comprises or forms a part of an envelope tracking system. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Examples of the invention will be described in terms of an ET architecture that comprises a dynamic power amplifier supply modulation circuit configured to reduce a slew rate and/or bandwidth of an envelope signal or a voltage supply reference in order to improve a supply modulator efficiency. In this manner, the whole transmitter efficiency may be improved, since the whole transmitter system efficiency is equal to a multiplication of the supply modulator efficiency and PA efficiency. In one example, a reduced bandwidth of the envelope signal may be applied at the input of a switching modulator or hybrid modulator, in order to increase its efficiency, for example to reduce switching loss and/or a bandwidth requirement for analog circuits contained in the transmitter. In one example, a reduced bandwidth of envelope signal may be used as the supply voltage of a linear amplifier employing a hybrid modulator in order to increase its efficiency, for example to reduce a voltage headroom of the linear amplifier, thereby increasing its operating efficiency.

Referring first to FIG. 4, a block diagram of a wireless communication unit (sometimes referred to as a mobile subscriber unit (MS) in the context of cellular communications or a user equipment (UE) in terms of a $3^{rd}$ generation partnership project (3GPP™) communication system) is shown, in accordance with one example embodiment of the invention. The wireless communication unit 400 contains an antenna 402 preferably coupled to a duplex filter or antenna switch 404 that provides isolation between receive and transmit chains within the wireless communication unit 400.

The receiver chain 410, as known in the art, includes receiver front-end circuitry 406 (effectively providing reception, filtering and intermediate or base-band frequency conversion). The front-end circuitry 406 is coupled to a signal processing function 408. An output from the signal processing function 408 is provided to a suitable user interface, which may encompass a screen or flat panel display. A controller 414 maintains overall subscriber unit control and is coupled to the receiver front-end circuitry 406 and the signal processing function 408 (generally realised by a digital signal processor (DSP)). The controller 414 is also coupled to a memory device 416 that selectively stores various operating regimes, such as decoding/encoding functions, synchronisation patterns, code sequences, and the like.

In accordance with examples of the invention, the memory device 416 stores modulation data, and power supply data for use in supply voltage control to track the envelope of the radio frequency waveform to be output by the wireless communication unit 400. Furthermore, a timer 418 is operably coupled to the controller 414 to control the timing of operations (transmission or reception of time-dependent signals and in a transmit sense the time domain variation of the PA supply voltage within the wireless communication unit 400).

As regards the transmit chain 420, this essentially includes the user interface, which may encompass a keypad or touch screen, coupled in series via signal processing function 408 to transmitter/modulation circuitry 422. The transmitter/modulation circuitry 422 processes input signals for transmission and modulates and up-converts these signals to a radio frequency (RF) signal for amplifying in the power amplifier module or integrated circuit 424. RF signals amplified by the PA module (or PA integrated circuit) 424 are passed to the antenna 402. The transmitter/modulation circuitry 422, power amplifier module 424 and PA supply voltage modulator 425 are each operationally responsive to the controller 414, with the PA supply voltage modulator 425 additionally responding to a reproduction of the envelope modulated waveform from the transmitter/modulation circuitry 422. In this manner, a PA supply voltage modulator 425 is arranged to modulate the supply voltage to the PA 424 in accordance with the envelope modulated waveform, thereby performing envelope tracking modulation of the supply voltage provided to the PA 424.

The signal processor function in the transmit chain may be implemented as distinct from the processor 408 in the receive chain 410. Alternatively, a single processor may be used to implement processing of both transmit and receive signals, as shown in FIG. 4. Clearly, the various components within the wireless communication unit 400 can be realised in discrete or integrated component form, with an ultimate structure therefore being merely an application-specific or design selection.

Furthermore, in accordance with examples of the invention, the transmitter/modulation circuitry 422, together with power amplifier 424, PA supply voltage modulator 425, memory device 416, timer function 418 and controller 414 have been adapted to generate a power supply to be applied to the PA 424. For example, a power supply is generated that is suitable for a wideband linear power amplifier, and configured to track the envelope waveform applied to the PA 424.

Referring to FIG. 5, there is illustrated an example block diagram of a dynamic power amplifier supply modulation circuit 500, adapted in accordance with some examples of the invention. In one example, the dynamic power amplifier supply modulation circuit 500 may be employed in the communication unit 400 of FIG. 4. The example block diagram of a dynamic power amplifier supply modulation circuit 500 supports ET as well as optionally supporting digital pre-distortion (DPD).

The envelope tracking system comprises: an envelope detector 505 arranged to receive and detect an instantaneous envelope of the input transmit signal 510, i.e. digital I/Q input signal 510, and calculate an envelope value thereof, where supply modulator 520 is operably coupled to a supply 535 of the PA module 555 and arranged to variably control a supply voltage therefor.

Further, in this illustrated example, the envelope detector 505 may be operably coupled to a first envelope to reference voltage (Vref) mapping module-1 515, which provides a mapping value (Vref1) from the calculated envelope value of the digital I/Q input signal 510, based on the detected envelope, to a supply voltage modulator 520 (sometimes referred to as an ET modulator or supply modulator). The mapping value (Vref1) is used to generate a supply voltage of Linear Amp 570 to create a target output power level 540 from the PA 555. In this example, utilising envelope tracking to control the output of the PA 555 may improve the efficiency of the PA 555 and utilising envelope tracking to control the output of the Linear Amp 570 may improve the efficiency of the Linear Amplifier 570.

In this illustrated example, a slew-rate reduction module 518 may be operably coupled between first envelope mapping module-1 515 and supply voltage modulator 520. Supply voltage modulator 520, which in this example is a hybrid supply voltage modulator, comprises a first DC-DC converter 522 arranged to receive the slew-rate modified version (V1) of the first envelope to Vref mapping value (Vref1).

The first DC-DC converter 522 then outputs a converted voltage reference signal to linear amplifier 570. In this manner, slew-rate reduction module 518 is able to control the supply voltage of the linear amplifier 570. In one example, control of slew-rate reduction module 518 may be performed by controller 414 of FIG. 4. In other examples, control of slew-rate reduction module 518 may be performed by any other signal processor or controller module.

Linear amplifier 570 also receives a second envelope to Vref2 mapping value (Vref2) output from a second envelope mapping module-2 525, in order to generate the PA supply voltage, Vpa 535. In accordance with some example embodiments, more accurate control of Vpa 535 may improve PA efficiency by reducing the voltage headroom of PA 555. In the same manner as first envelope to reference voltage (Vref) mapping module-1 515, second envelope mapping module-2 525 also receives the calculated envelope value from envelope detector 505 and provides a mapping value direct to linear amplifier 570. Notably, the RF transmitter 500 further comprises a second envelope to supply mapping component 525 operably coupled to envelope detector 505 arranged to provide an input (Vref2) to linear amplifier 570 of the supply modulator 520.

According to some example embodiments, the communication unit comprises a radio frequency, RF, transmitter 500 comprising: a transmit path comprising: a digital predistortion, DPD, module 560 arranged to receive and distort an input transmit signal, i.e. digital I/Q input signal 510; and an RF transmit block 550 arranged to receive the distorted transmit signal and to convert the digitally predistorted signal to an analog form, amplify and up-convert the distorted transmit signal and apply the amplified, up-converted distorted transmit signal 530 to the PA module 555. In some examples, DPD 560 may additionally receive a control signal (not shown) in order to adjust the baseband (digital) signals to compensate for AM-AM and AM-PM distortion that will be introduced by PA 555. This is typically generated and routed back via a coupler located between the PA 555 and an antenna (not shown). Notably, in accordance with some example embodiments of the invention, the DPD 560 may also optionally receive a second input signal (Vref2) from an output of the second envelope mapping module-2 525. In this manner, improved PA linearity may be achieved with the DPD receiving an indication of the instantaneous envelope signal level. The digitally pre-distorted output signals from DPD 560 are input to RF transmitter module 550, which converts the signals to analog form and up-converts the signal to an RF signal for inputting to the PA 555. In some examples, RF transmitter module 550 may further comprise a low pass filter, variable gain amplifier, mixer and frequency synthesiser (not shown). In one example, calibration of a transmit chain of the RF transmitter module 550 is performed in order to calibrate the PA 555 and analogue transmit gain functions contained within RF transmitter module 550.

The output of the linear amplifier 570 is arranged to generate supply (Vpa) 535 of the PA module 555, with a suitable DC level shift introduced by summing junction 572 that also receives an input from second DC-DC converter 575. Second DC-DC converter 575 receives a DC level shift value (V3) from DSP 580 based on a transmit power control (TPC) signal and provides an adjustment value between linear amplifier output voltage and VPA 535. The DC level shift value (V3) from DSP 580 is the DC component of Vpa 535, which is calculated by DSP 580 with information from a transmit power control (TPC) module (not shown), based on, say, a specific standard, such as 3GPP™. In accordance with example embodiments of the invention, slew-rate reduction module 518 is arranged to provide an even and therefore reduced re-distribution of a maximum slew rate and bandwidth of the signal envelope (first envelope to Vref mapping value (Vref1)), in order to improve the efficiency of supply modulator 520. For example, the output signal (V1) from slew-rate reduction module 518 may improve an efficiency of (hybrid) supply modulator 520 by reducing a voltage headroom of linear amplifier 570. Furthermore, the first envelope tracking path that produces V1 may be operated at a much lower sampling rate than the second envelope tracking path (resulting in Vref2) in order to conserve more power.

In order to best appreciate the operation of the slew-rate reduction module 518, let us consider an input sequence of: [0 0 0 0 0 3]. An output sequence from a known supply modulator, following this input sequence would be: [0 0 0 1 2 3]. As illustrated, the slew rate is not evenly distributed across the sampled input signal, thereby leading to potential problems of overload or under-load.

However, in contrast to the known prior art, employing the slew-rate reduction module 518 according to example embodiments of the invention, the output sequence of FIG. 5 is: [0.6 1.2 1.8 2.4 3.0]. In this manner, the slew rate is now evenly distributed and manageable, thereby preventing overload or under-load problems.

Figure 6:
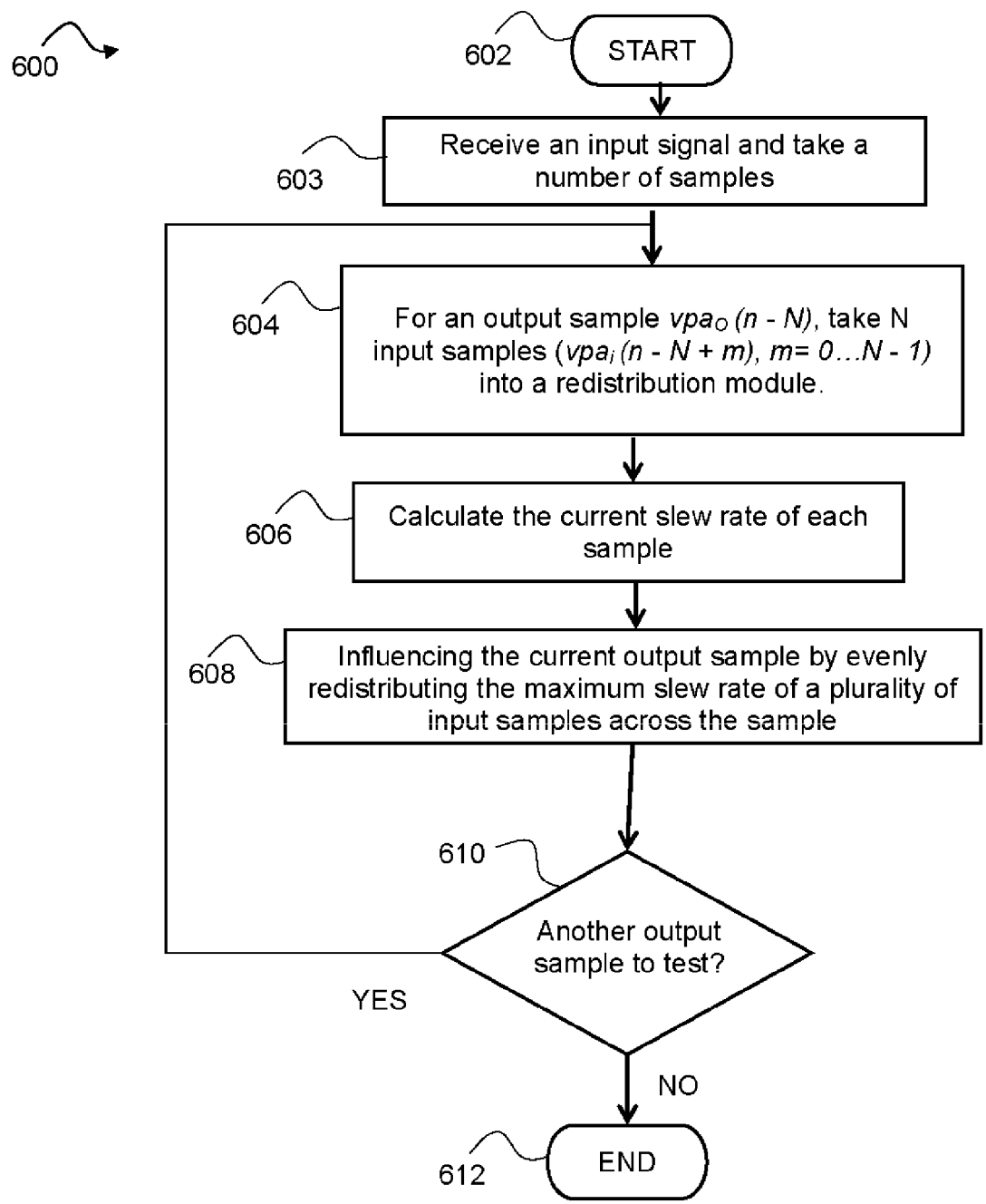
FIG. 6 illustrates an example flowchart of a method of controlling a power amplifier supply modulation circuit employing envelope tracking, according to some examples of the invention.

Referring now to FIG. 6, there is illustrated an example flowchart 600 for controlling a power amplifier supply modulation circuit employing envelope tracking according to some example embodiments of the invention. The flowchart commences at 602 and transitions to 603 where an input signal is received and a plurality of samples of the input signal are processed. At 604, for example, the slew-rate reduction module 518 of FIG. 5 may take N input samples [1]:

$$(vpa_i(n-N+m), m=0 \ldots N-1) \quad [1]$$

for each output sample [2] provided by, say, first envelope to reference voltage (Vref) mapping module-1 515 of FIG. 5:

$$vpa_o(n-N) \quad [2]$$

For this example, $Vpa_i$ is Vref1 and $Vpa_o$ is V1 of FIG. 5.

At 606, slew-rate reduction module 518 may then be arranged to calculate a current slew rate of each input sample [1], for example according to [3]:

$$SR(1) = [vpa_i(n-N) - vpa_o(n-N-1)]/1 \quad [3]$$
$$SR(2) = [vpa_i(n-N+1) - vpa_o(n-N-1)]/2$$
$$SR(3) = [vpa_i(n-N+2) - vpa_o(n-N-1)]/3$$
$$\vdots$$
$$SR(N) = [vpa_i(n-N+N-1) - vpa_o(n-N-1)]/N$$

At 608, and based thereon, slew-rate reduction module 518 may then be arranged to influence a current output single by evenly re-distributing a maximum slew rate of a plurality of input samples across the output single, for example according to [4]:

$$vpa_o(n-N) = vpa_o(n-N-1) + \max[S(1), S(2), S(3), \ldots S(N)]. \quad [4]$$

In one example, at 610, the slew-rate reduction module 518 may then repeat this process for the next and subsequent output sample (s) [2] until the transmission is complete, when the process ends at 612.

In this manner, the slew rate of the signal envelope (first envelope to Vref mapping value (Vref1)) may be evenly distributed and manageable. Hence, in some examples, overload or under-load of the signal envelope may be avoided. Furthermore, the slew-rate modified version (V1) of the first envelope signal may be better able to track the peak of the original envelope signal. In addition, both the bandwidth and slew rate of the first envelope signal can be reduced. Such a solution to the aforementioned problem is notably low in complexity.

Figure 7:
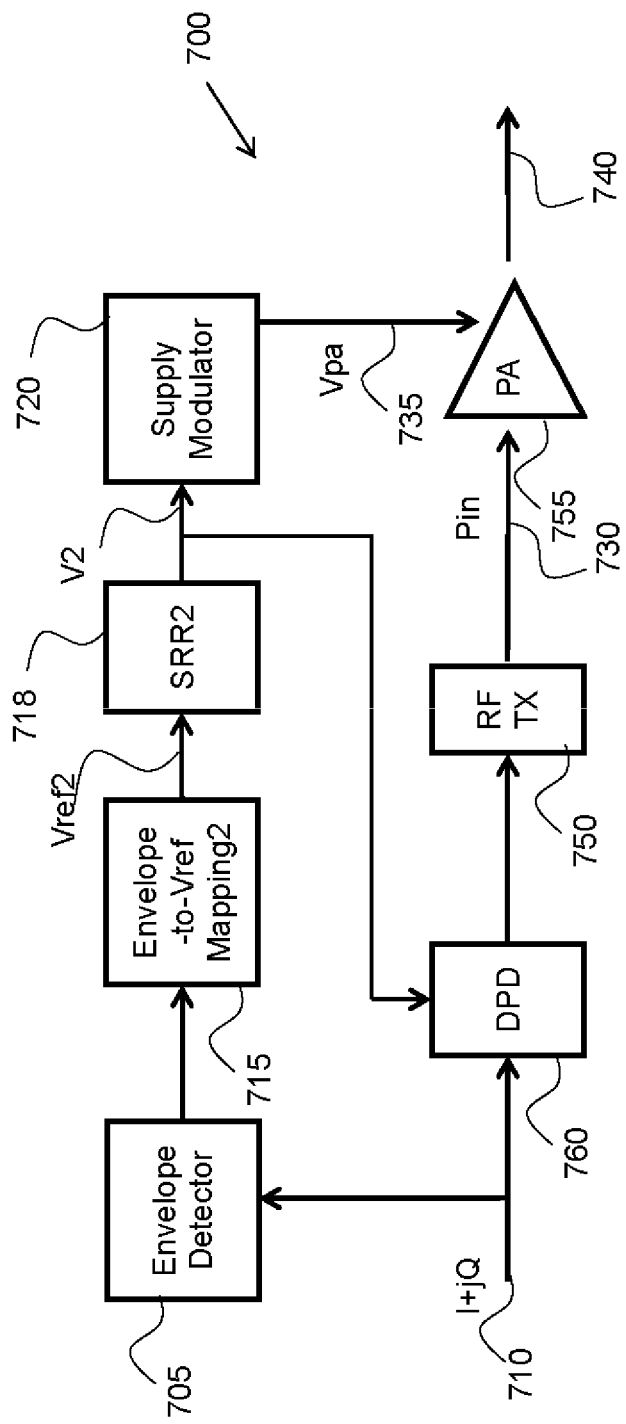
FIG. 7 illustrates a further block diagram of a dynamic power amplifier supply modulation circuit employing envelope tracking and adapted in accordance with some examples of the invention

Referring to FIG. 7, there is illustrated an example block diagram of a further dynamic power amplifier supply modulation circuit 700, adapted in accordance with some examples of the invention. In one example, the dynamic power amplifier supply modulation circuit 700 may be employed in the communication unit 400 of FIG. 4. The example block diagram of a dynamic power amplifier supply modulation circuit 700 supports ET, as well as optionally supporting digital pre-distortion (DPD). The illustrated example of FIG. 7 has many features in common with FIG. 5, and, thus, only additional aspects will be discussed in detail.

In some examples, the further dynamic power amplifier supply modulation circuit 700 may comprise an envelope detector module 705 operable to receive a digital I/Q input signal 710 and calculate an envelope value from the digital I/Q signal 710. In this illustrated example, the envelope detector 705 is operably coupled to a single (when compared to FIG. 5) envelope to reference voltage (Vref) mapping module-2 715, which may provide a mapping value based on the detected envelope to an input signal (V2) to supply voltage modulator 720, in order to generate a PA supply voltage (Vpa) 735, thereby to create a target output power level 740 from the PA 755. In this example, utilising envelope tracking to control the output of the PA 755 may improve the efficiency of the PA 755, for example by reducing a voltage headroom used (e.g. voltage range to be supported) by the PA 755.

In this illustrated example, a (second) slew-rate reduction module 718 may be operably coupled between (second) envelope mapping module-2 715 and supply voltage modulator 720. Supply voltage modulator 720, which in this example may be either a hybrid supply voltage modulator or a switching supply voltage modulator and may comprise a (second) DC-DC converter (not shown), is arranged to receive the slew-rate modified version (V2) of the second envelope to Vref mapping value (Vref2).

By careful control of the (second) slew-rate reduction module 718 and signals or values output therefrom, the slew-rate modified version (V2) of the second envelope to Vref mapping value (Vref2) may improve an efficiency of a hybrid modulator version of the supply modulator 720, for example by reducing a bandwidth and slew rate of V2 and therefore reducing one or more performance requirement(s) placed on a linear amplifier of hybrid modulator. Alternatively, by careful control of the (second) slew-rate reduction module 718, the slew-rate modified version (V2) of the second envelope to Vref mapping value (Vref2) may improve an efficiency performance of a switching modulator version of the supply modulator 720, by reducing a bandwidth and slew rate of V2 and therefore reducing one or more performance requirement(s) placed on the switching modulator. Thus, in this manner, (second) slew-rate reduction module 718 may be configured to reduce a slew rate and/or a signal bandwidth of the ET signal (Vref2) output from second envelope mapping module-2 715. In one example, control of slew-rate reduction module 718 may be performed by controller 414 of FIG. 4. In other examples, control of slew-rate reduction module 718 may be performed by any other signal processor or controller module.

In order to address the linearity requirements of the transmitter, digital I/Q input signal 710 may also be input to DPD 760. DPD 760 receives and adjusts the digital I/Q signal 710 to compensate for AM-AM and AM-PM distortion that will be introduced by PA 755. Notably, in accordance with some example embodiments of the invention, the DPD 760 also optionally receives a second input signal (V2) from an output of the (second) slew-rate reduction module 718, dependent upon the envelope-to-reference voltage (Vref2) mapping value. In this manner, improved PA linearity may be achieved with the DPD additionally receiving an indication of the instantaneous envelope signal level, as adjusted by slew-rate reduction module 718. The digitally pre-distorted output signals from DPD 760 are input to RF transmitter module 750, which converts the signals to analog form and up-converts the signal to an RF signal for inputting to the PA 755. In some examples, RF transmitter module 750 may further comprise a low pass filter, variable gain amplifier, mixer and frequency synthesiser (not shown).

In accordance with example embodiments of the invention, slew-rate reduction module 718 is arranged to provide an even re-distribution (and therefore reduced) slew rate and bandwidth of the signal envelope mapping value (first envelope to Vref mapping value (Vref2)), in order to improve the efficiency of supply modulator 720. For example, the output signal (V2) from slew-rate reduction module 718 may improve an efficiency of (hybrid) supply modulator 720 by reducing bandwidth and/or slew rate of (hybrid) supply modulator 720.

Figure 8:
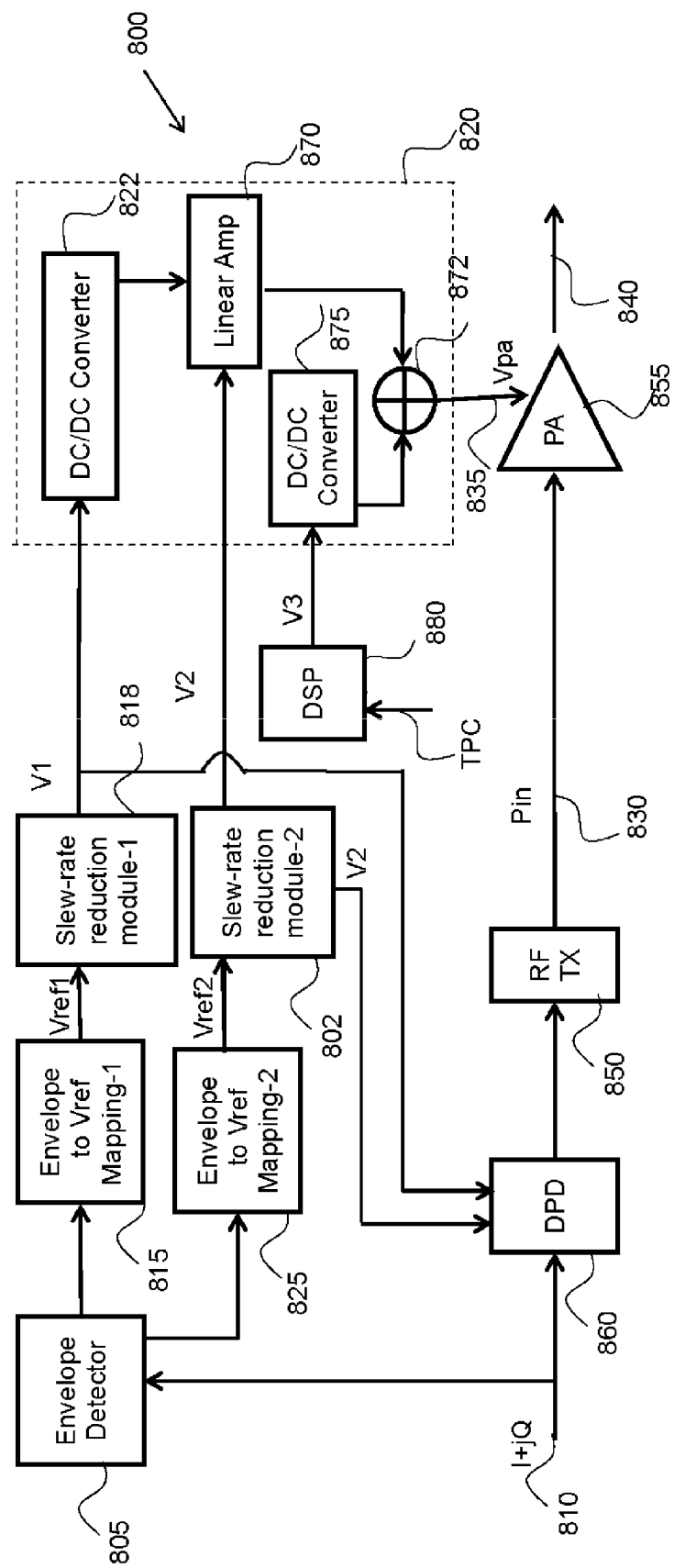
FIG. 8 illustrates a yet further block diagram of a dynamic power amplifier supply modulation circuit, according to some examples of the invention.

Referring to FIG. 8, there is illustrated an example block diagram of a dynamic power amplifier supply modulation circuit 800, adapted in accordance with some examples of the invention. In one example, the dynamic power amplifier supply modulation circuit 800 may be employed in the communication unit 400 of FIG. 4. According to some example embodiments of the invention, the envelope tracking system comprises an envelope detector 805 arranged to detect an instantaneous envelope value of the input transmit digital I/Q input signal 810. Further, in this illustrated example, an output of the envelope detector 805 is operably coupled to a first envelope to reference voltage (Vref) mapping module-1 815, which provides a mapping value dependent upon the calculated envelope value to a power amplifier supply voltage modulator 820. The first envelope to supply mapping component 815 is arranged to set a supply voltage level (V1) of a linear amplifier 870 of supply modulator 820 based on a detected envelope, where supply modulator 820 is operably coupled to a supply 835 of the PA module 855 and arranged to variably control a supply voltage therefor.

The example block diagram of a dynamic power amplifier supply modulation circuit 800 supports ET as well as optionally supporting digital pre-distortion (DPD). In this example, power amplifier supply voltage modulator 820 is a hybrid modulator.

Additionally, in this illustrated example, the envelope detector 805 is also operably coupled to a second envelope to reference voltage (Vref) mapping module-2 825, which also provides a mapping value dependent upon the calculated envelope value to the power amplifier supply voltage modulator 820. In this example, the two mapping values are provided to a linear amplifier 870, in order to generate a PA supply voltage (Vpa) 835, which in turn creates a target output power level 840 from the PA 855.

In this illustrated example, each of the mapping values are input to respective slew rate reduction modules 818, 802, in order to modify the mapping values according to a desired reduced slew rate and/or reduced bandwidth of the signals (Vref1 and Vref2) passing therethrough. Thus, a first slew-rate reduction module 818 may be operably coupled between first envelope mapping module-1 815 and supply voltage modulator 820. Supply voltage modulator 820, which in this example is a hybrid supply voltage modulator, comprises a first DC-DC converter 822 arranged to receive the first slew-rate modified version (V1) of the first envelope to Vref mapping value (Vref1). In this manner, slew-rate reduction module 818 is able to control the supply voltage of the Linear Amplifier 870, by control/manipulation of the first slew-rate modified version (V1) of the first envelope to Vref mapping value (Vref1). In one example, the first slew-rate modified version (V1) of the first envelope to Vref mapping value (Vref1) may be able to improve the operating efficiency of hybrid supply voltage modulator by reducing a voltage headroom employed by the linear amplifier 870.

In this example, a second slew-rate reduction module 802 is operably coupled between second envelope mapping module-2 825 and supply voltage modulator 820. In this example, linear amplifier 870 also receives a slew-rate modified version (V2) of second envelope-to-Vref2 mapping value (Vref2) output from the second envelope mapping module-2 825, in order to generate the PA supply voltage, Vpa 835. In accordance with some example embodiments, the slew-rate modified version (V2) of second envelope-to-Vref2 mapping value (Vref2) may improve the operating efficiency of the hybrid supply modulator 820 by reducing an operating bandwidth and/or a slew rate requirement of linear amplifier 870.

Thus, in accordance with example embodiments of the invention, first slew-rate reduction module 818 and second slew-rate reduction module 802 are both arranged to provide an even (and therefore reduced) re-distribution of slew rate and bandwidth of the first envelope to Vref mapping value (Vref1) and second envelope to Vref mapping value (Vref2), in order to improve the efficiency of supply modulator 820.

The output of the linear amplifier 870 is arranged to generate supply (Vpa) 835 of the PA module 855, with a suitable DC level shift introduced by summing junction 872 that also receives an input from a second DC-DC converter 875. Second DC-DC converter 875 receives a DC level shift value (V3) from digital signal processor (DSP) 880, based on a transmit power control (TPC) signal, and provides an adjustment value between linear amplifier output voltage and VPA 835. The DC level shift value (V3) from DSP 880 is the DC component of Vpa 835, which is calculated by DSP 880 with information from a transmit power control (TPC) module (not shown), based on, say, a specific standard, such as 3GPP™.

In one example, the first slew-rate modified version (V1) path can be operated at a much lower sampling rate than the second slew-rate modified version (V2) path in order to save even more power. In this manner, this example facilitates usage of less expensive and lower performance DC-DC converter 822 in hybrid modulator 820

In order to address the linearity requirements of the transmitter, digital I/Q input signal 810 may also be input to DPD 860. DPD 860 receives inputs to adjust the digital I/Q input signal 810 in order to compensate for amplitude modulationto-amplitude modulation (AM-AM) and amplitude modulation-to-phase modulation (AM-PM) distortion that will be introduced by PA 855. Notably, in accordance with some example embodiments of the invention, the DPD 860 may also optionally receive a second input signal (V1) from an output of the (first) slew-rate reduction module 818, dependent upon the envelope-to-reference voltage (Vref1) mapping value that is output from the first envelope-to-Vref mapping module-1 818. As mentioned, in one example, (first) slew-rate reduction module 818 is used to reduce the bandwidth and/or slew rate of the output (Vref1) of first envelope mapping module-1 815 in order to improve the efficiency of Linear Amplifier 870. As such, second input signal (V1) output from (first) slew-rate reduction module 818 is used to control the supply voltage of Linear Amplifier 870 and the efficiency of Linear Amplifier 870 can be further improved by reducing voltage headroom of Linear Amplifier 870 through first envelope mapping module-1 815. However, in some instances, this may cause some distortion on the output signal of the Linear Amplifier 870, and therefore Vpa 835 and hence PA output 840. Therefore, providing the second input signal (V1) from an output of the (first) slew-rate reduction module 818 to DPD 860 is useful in DPD 860 compensating for any such generated non-linearity.

Furthermore, in accordance with some example embodiments of the invention, the DPD 860 may also optionally receive a third input signal (V2) from an output of the (second) slew-rate reduction module 802, dependent upon the envelope-to-reference voltage (Vref2) mapping value output from the second envelope-to-Vref mapping module-2 825. In one example, third input signal (V2) may be used to control Vpa 835, and as such if the bandwidth and/or slew rate of V2 is reduced, DPD 860 is provided with a representation of third input signal (V2) to compensate for the fact that the PA 855 is no longer operated at constant gain.

Notably, in the example of FIG. 8, second input signal (V1) and third input signal (V2) are advantageously independently controlled and applied to DPD 860, as compared to the Vref signal applied to DPD 560 in FIG. 5, thereby providing more flexibility and control in the PA linearization process.

In this manner, improved PA linearity may be achieved with the DPD receiving an indication of the instantaneous envelope signal level. The digitally pre-distorted output signals from DPD 860 are input to RF transmitter module 850, which converts the signals to analog form and up-converts the signal to an RF signal for inputting to the PA 855. In some examples, RF transmitter module 850 may further comprise a low pass filter, variable gain amplifier, mixer and frequency synthesiser (not shown).

Figure 9:
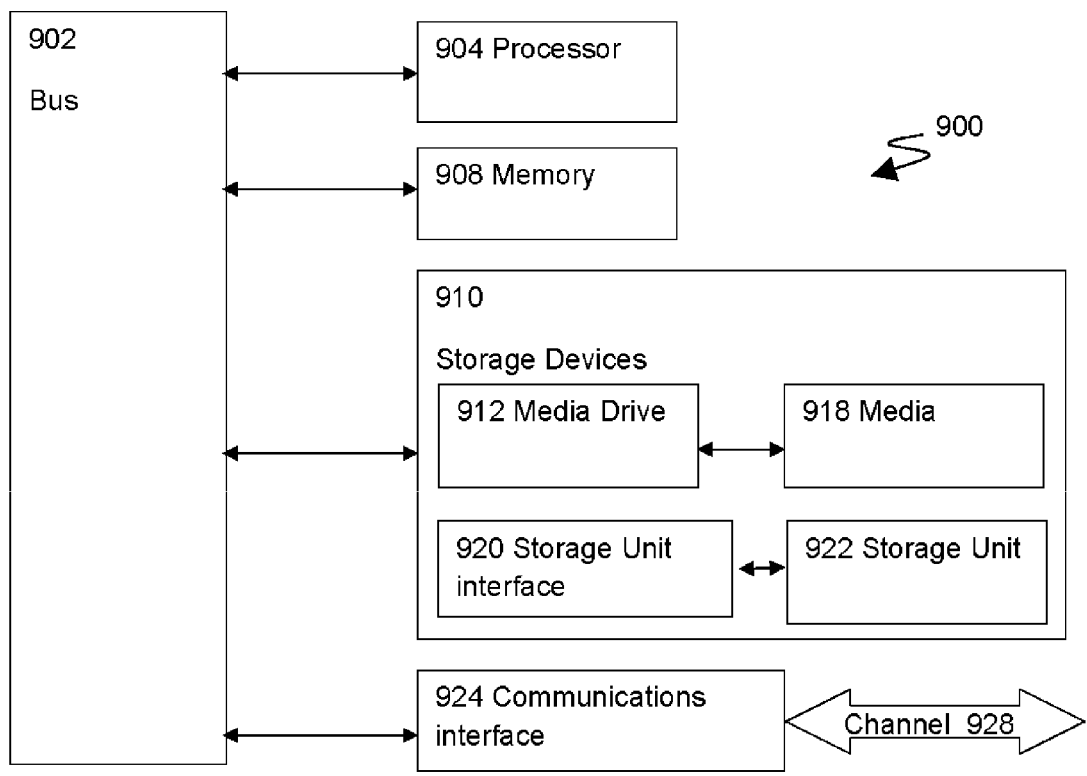
FIG. 9 illustrates a simplified example of a typical computing system that may be employed to implement signal processing functionality in embodiments of the invention.

Referring now to FIG. 9, there is illustrated a typical computing system 900 that may be employed to implement software-controlled power control functionality in embodiments of the invention that utilize envelope tracking and load control. Computing systems of this type may be used in wireless communication units, such as base stations eNodeBs. Those skilled in the relevant art will also recognize how to implement the invention using other computer systems or architectures. For example, computing system 900 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 900 can include one or more processors, such as a processor 904. Processor 904 can be implemented using a general or special-purpose processing engine such as, for example, a microprocessor, microcontroller or other control logic. In this example, processor 904 is connected to a bus 902 or other communications medium.

Computing system 900 can also include a main memory 908, such as random access memory (RAM) or other dynamic memory, for storing information and instructions to be executed by processor 904. Main memory 908 also may be used for storing temporary variables or other intermediate information during execution of instructions to be executed by processor 904. Computing system 900 may likewise include a read only memory (ROM) or other static storage device coupled to bus 902 for storing static information and instructions for processor 904.

In some examples, computing system 900 may be operable to implement various software programs to control a power amplifier load modulation circuit in a calibration state and/or control a power amplifier load modulation circuit in a transmission state.

The computing system 900 may also include information storage system 910, which may include, for example, a media drive 912 and a removable storage interface 920. The media drive 912 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 918 may include, for example, a hard disk, floppy disk, magnetic tape, optical disk, CD or DVD, or other fixed or removable medium that is read by and written to by media drive 912. As these examples illustrate, the storage media 918 may include a computer-readable storage medium having particular computer software or data stored therein.

In alternative embodiments, information storage system 910 may include other similar components for allowing computer programs or other instructions or data to be loaded into computing system 900. Such components may include, for example, a removable storage unit 922 and an interface 920, such as a program cartridge and cartridge interface, a removable memory (for example, a flash memory or other removable memory module) and memory slot, and other removable storage units 922 and interfaces 920 that allow software and data to be transferred from the removable storage unit 922 to computing system 900.

Computing system 900 can also include a communications interface 924. Communications interface 924 can be used to allow software and data to be transferred between computing system 900 and external devices. Examples of communications interface 924 can include a modem, a network interface (such as an Ethernet or other NIC card), a communications port (such as for example, a universal serial bus (USB) port), a PCMCIA slot and card, etc. Software and data transferred via communications interface 924 are in the form of signals which can be electronic, electromagnetic, and optical or other signals capable of being received by communications interface 924. These signals are provided to communications interface 924 via a channel 928. This channel 928 may carry signals and may be implemented using a wireless medium, wire or cable, fiber optics, or other communications medium. Some examples of a channel include a phone line, a cellular phone link, an RF link, a network interface, a local or wide area network, and other communications channels.

In some further alternative embodiments, part or all of computing system 900 may be operably coupled through a real-time communication network, for example the internet. Therefore, in some cases, the architecture of computing system 900 may be geographically distributed over a network, with the means and ability to run the distributed parts of computing system 900 simultaneously. In some further embodiments, computing system 900 may be operably coupled to one or more further computing systems via a distributed computing network.

In this document, the terms 'computer program product', 'computer-readable medium' and the like may be used generally to refer to media such as, for example, memory 908, storage device 918, or storage unit 922. These and other forms of computer-readable media may store one or more instructions for use by processor 904, to cause the processor to perform specified operations. Such instructions, generally referred to as 'computer program code' (which may be grouped in the form of computer programs or other groupings), when executed, enable the computing system 900 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 900 using, for example, removable storage drive 922, drive 912 or communications interface 924. The control logic (in this example, software instructions or computer program code), when executed by the processor 904, causes the processor 904 to perform the functions of the invention as described herein.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

For example, in some example embodiments, it is envisaged that the power controller and load controlled may be combined within a single controller. Furthermore, in some example embodiments, although the LUTs have been described individually, thereby suggesting that they may comprise separate memory elements, it is envisaged that a number or each may form a portion of a single LUT or memory element.

Also for example, the various components/modules, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A communication unit comprising:
   an envelope tracking system operably coupled to a power amplifier, PA, module and comprising:
   at least one slew rate module arranged to re-distribute a slew rate across a number of input samples according to a maximum slew rate of the number of input samples, wherein the maximum slew rate is dynamically calculated; and
   a supply modulator arranged to variably control a supply voltage for the PA module in response to an output of the at least one slew rate module.

2. The communication unit of claim 1 wherein the at least one slew rate module limits a slew rate of an output sequence from the supply modulator to be applied to a supply of the PA module.

3. The communication unit of claim 1 wherein the at least one slew-rate module takes the number of input samples $(vpa_i(n-N+m), m=0 \ldots N-1)$ for each output sample provided by a envelope to reference voltage mapping module which is configured to map an envelope of an input signal of the communication unit to the supply voltage to be applied to the PA module.

4. The communication unit of claim 3 wherein the at least one slew-rate module calculates a current slew rate $S(m)$ corresponding to a current input sample $vpa_i(n-N+m)$ of the N input samples according to the current input sample and an output sample provided by the envelope to reference voltage mapping module.

5. The communication unit of claim 4 wherein the at least one slew-rate module influences a current output sample $vpa_o(n-N)$ of the envelope to reference voltage mapping module according to:

$$vpa_o(n-N)=vpa_o(n-N-1)+\max[S(1),S(2),S(3),\ldots,S(N)].$$

6. The communication unit of claim 1 wherein a slew rate of envelope to reference voltage mapping values of the envelope tracking system is manageable, wherein the envelope to reference voltage mapping values are utilized to control the supply voltage to be applied to the PA module.

7. The communication unit of claim 1 wherein a slew rate of envelope to reference voltage mapping values of the envelope tracking system is evenly distributed, wherein the envelope to reference voltage mapping values are utilized to control the supply voltage to be applied to the PA module.

8. A method of envelope tracking in a wireless communication unit, the method comprising:
receiving an input signal with an envelope that varies with time;
mapping the envelope of the input signal to a power supply voltage to be applied to a power amplifier module to produce a voltage reference signal;
sampling the voltage reference signal;
re-distributing a slew rate across a plurality of input samples of the voltage reference signal according to a maximum slew rate of the plurality of input samples so as to provide an output sample variably controlling a supply voltage for the PA module, wherein the maximum slew rate is dynamically calculated.

9. The method of claim 8, wherein a slew rate of an output sample sequence variably controlling the supply voltage for the PA module is limited.

10. The method of claim 8, wherein the step of re-distributing the slew rate across the plurality of input samples of the voltage reference signal comprises calculating a current slew rate $S(m)$ corresponding to a current input sample $vpa_i(n-N+m)$ of the plurality of input samples.

11. The method of claim 10, wherein the step of re-distributing the slew rate across the plurality of input samples of the voltage reference signal further comprises:
influencing a current output sample $vpa_o(n-N)$ utilized to variably control the supply voltage for the PA module according to:

$$vpa_o(n-N)=vpa_o(n-N-1)+\max[S(1),S(2),S(3),\ldots S(N)].$$

12. The method of claim 8, wherein a slew rate of the output sample variably controlling the supply voltage for the PA module is manageable.

13. The method of claim 8, wherein a slew rate of the output sample variably controlling the supply voltage for the PA module is evenly distributed.

14. A communication unit comprising:
an envelope tracking system operably coupled to a power amplifier, PA, module and comprising:
at least one slew rate module arranged to re-distribute a slew rate across a number of input samples according to a maximum slew rate of the number of input samples; and
a supply modulator arranged to variably control a supply voltage for the PA module in response to an output of the at least one slew rate module;
wherein the at least one slew rate module limits a slew rate of an output sequence from the supply modulator to be applied to a supply of the PA module.

15. A communication unit comprising:
an envelope tracking system operably coupled to a power amplifier, PA, module and comprising:
at least one slew rate module arranged to re-distribute a slew rate across a number of input samples according to a maximum slew rate of the number of input samples; and
a supply modulator arranged to variably control a supply voltage for the PA module in response to an output of the at least one slew rate module;
wherein a slew rate of envelope to reference voltage mapping values of the envelope tracking system is manageable, and the envelope to reference voltage mapping values are utilized to control the supply voltage to be applied to the PA module.

16. A method of envelope tracking in a wireless communication unit, the method comprising:
receiving an input signal with an envelope that varies with time;
mapping the envelope of the input signal to a power supply voltage to be applied to a power amplifier (PA) module to produce a voltage reference signal;
sampling the voltage reference signal; and
re-distributing a slew rate across a plurality of input samples of the voltage reference signal to provide an output sample variably controlling a supply voltage for the PA module;
wherein a slew rate of an output sample sequence variably controlling the supply voltage for the PA module is limited.

17. A method of envelope tracking in a wireless communication unit, the method comprising:
receiving an input signal with an envelope that varies with time;
mapping the envelope of the input signal to a power supply voltage to be applied to a power amplifier (PA) module to produce a voltage reference signal;
sampling the voltage reference signal; and
re-distributing a slew rate across a plurality of input samples of the voltage reference signal to provide an output sample variably controlling a supply voltage for the PA module;
wherein the step of re-distributing the slew rate across the plurality of input samples of the voltage reference signal comprises calculating a current slew rate $S(m)$ corresponding to a current input sample $vpa_i(n-N+m)$ of the plurality of input samples.

18. A method of envelope tracking in a wireless communication unit, the method comprising:
receiving an input signal with an envelope that varies with time;
mapping the envelope of the input signal to a power supply voltage to be applied to a power amplifier (PA) module to produce a voltage reference signal;
sampling the voltage reference signal; and
re-distributing a slew rate across a plurality of input samples of the voltage reference signal to provide an output sample variably controlling a supply voltage for the PA module;
wherein a slew rate of the output sample variably controlling the supply voltage for the PA module is manageable.

* * * * *